United States Patent
Mattausch

(12) 
(10) Patent No.: US 6,557,085 B1
(45) Date of Patent: Apr. 29, 2003

(54) CIRCUIT CONFIGURATION FOR HANDLING ACCESS CONTENTIONS

(75) Inventor: Hans-Jürgen Mattausch, Higashi-Hiroshima (JP)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/154,486

(22) Filed: Sep. 16, 1998

(30) Foreign Application Priority Data

Sep. 16, 1997 (DE) .......................... 197 40 694

(51) Int. Cl.$^7$ .............................................. G06F 12/14
(52) U.S. Cl. ...................... 711/150; 711/151; 711/158; 711/168
(58) Field of Search ................................ 711/150, 151, 711/158, 168, 147, 131, 149; 710/240

(56) References Cited

U.S. PATENT DOCUMENTS

| | | | | |
|---|---|---|---|---|
| 4,652,993 A | * | 3/1987 | Scheuneman et al. | ...... 711/151 |
| 5,062,081 A | | 10/1991 | Runaldue | |
| 5,214,769 A | * | 5/1993 | Uchida et al. | .............. 711/151 |
| 5,276,842 A | | 1/1994 | Sugita | |
| 5,289,427 A | | 2/1994 | Nicholes et al. | |
| 5,434,818 A | | 7/1995 | Byers et al. | |
| 5,875,339 A | * | 2/1999 | Molnar et al. | .............. 710/240 |
| 5,898,840 A | * | 4/1999 | Guzovskiy et al. | .......... 709/226 |
| 5,960,458 A | * | 9/1999 | Kametani | ................... 711/147 |

FOREIGN PATENT DOCUMENTS

| | | |
|---|---|---|
| EP | 0 620 533 A2 | 10/1994 |
| KR | 10-1996-0001962 | 8/1997 |

OTHER PUBLICATIONS

"Speicherkonfigurationen mit Dual–Port–SRAMs", Hans Bliklen, Design & Elektronik, vol. 12, Jun. 1987, p. 106 and 108.

"Multi–Port Dynamic Random Access Memory Controller", IBM Technical Disclosure Bulletin, vol. 34, No. 2, Jul. 1991, pp. 495–498.

* cited by examiner

Primary Examiner—Do Hyun Yoo
Assistant Examiner—Brian R. Peugh
(74) Attorney, Agent, or Firm—Laurence A. Greenberg; Werner H. Stemer; Ralph E. Locher

(57) ABSTRACT

The circuit handles access contentions in memories with a plurality of mutually independent, addressable I/O ports. There are provided two subcircuits, namely the so-called contention identification circuit and the so-called access inhibit circuit. The contention identification circuit identifies an access contention between two or more ports and generates a status signal. This status signal is communicated to the contention inhibit circuit. The contention inhibit circuit allocates a priority to each of the ports which are involved in the access contention. Based on the prioritization, the highest prioritized port is enabled, while the remaining ports are inhibited (temporarily disabled). The prioritization proceeds according to a predetermined algorithm. Two specific prioritization algorithms are given, namely a simple so-called PIH algorithm, in which the ports are hierarchically designated and a so-called "fair" IPIH algorithm.

3 Claims, 3 Drawing Sheets

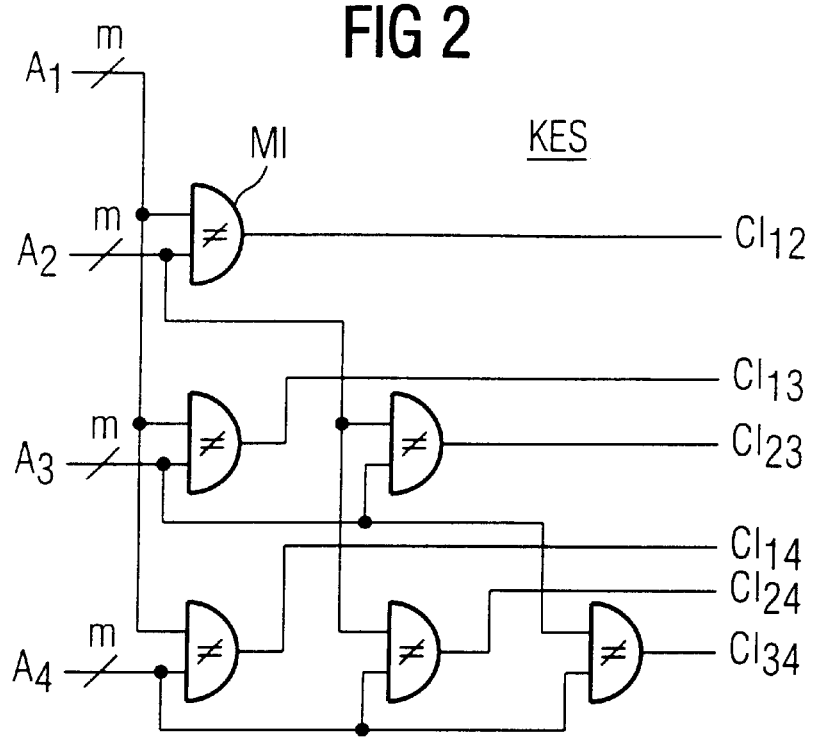
FIG 2
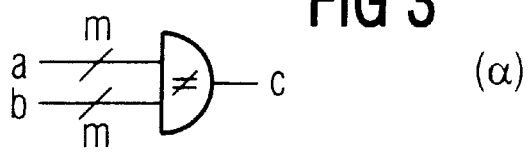
(α)
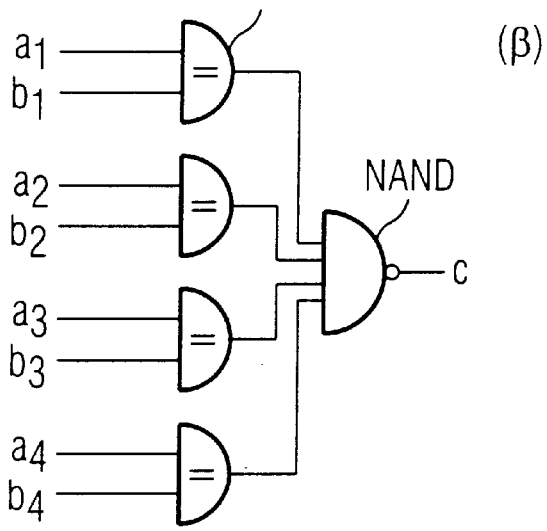
(β)

CIRCUIT CONFIGURATION FOR HANDLING ACCESS CONTENTIONS

BACKGROUND OF THE INVENTION

Field of the Invention

The invention is in the electronics field. More specifically, the invention relates to a circuit configuration for handling and resolving access contentions in memories with a plurality of mutually independent I/O ports that can be simultaneously addressed in parallel.

Future microelectronic circuits will realize complicated systems with transistors numbering between $10^{12}$ and $10^{15}$. Those systems, such as, for example, parallel processor systems, artificial intelligence systems, or multimedia systems, will, as a rule, contain a plurality of cooperating subsystems for processing data. A crucial problem for efficient practical realization of those systems will thus be the storage of the data to be processed and also of the data processing programs. The most powerful systems will surely be able to be realized when a memory is available which the subsystems can access temporally in parallel and with a high bandwidth.

An attractive solution to this problem is the use of so-called multi-port memories, which have a multiplicity of independent connection ports which external assemblies can access temporally in parallel.

However, access contentions can arise in all multi-port memories having independently addressable ports. An access conflict or access contention arises when two or more ports wish to access the same memory cell simultaneously. Whether such an access contention arises only during write operations or else during write/read operations depends on the chosen memory architecture. In conventional multi-port memories, in which all of the connection ports are implemented in each of the memory cells, an access contention arises exclusively during a write access. In multi-port memories which have one-port memory cells, such as, for example, a so-called switching network or a hierarchically constructed memory architecture, an access contention arises both during a write access and during a read access.

The above-described problem of access contention rarely manifested itself in the past since multi-port memories having mutually independently addressable ports have rarely been used to date in integrated systems.

In systems in which multi-port memories were nevertheless used, an access contention was usually resolved at the system end. This means that an access contention was identified by the system containing the multi-port memory and an assignment of the data was made program-specifically for each port. Thus, the memory itself was not provided with any dedicated means for handling access contentions. Consequently, additional circuitry and/or programming complexity was necessary at the system end in order to operate a multi-port memory of this type.

In a further approach for handling access contentions in multi-port memories, the various external connection ports were switched internally to a single port. In the event of an access contention, which always arises in the event of simultaneous access by a plurality of ports, the data were processed sequentially, for example by a simple multiplexer and a small buffer store, via the single internal connection port. Consequently, however, a multi-port memory of this type has the operating behavior of a one-port memory.

SUMMARY OF THE INVENTION

It is accordingly an object of the invention to provide a circuit configuration for handling access contentions in multi-port memories, which overcomes the above-mentioned disadvantages of the heretofore-known devices and methods of this general type.

With the foregoing and other objects in view there is provided, in accordance with the invention, a circuit configuration for handling access contentions in a memory with a plurality of mutually independent, simultaneously addressable I/O ports, comprising:

at least one contention identification circuit for identifying an access contention between a plurality of I/O ports to a given memory cell of a memory; and at least one contention inhibit circuit connected to the contention identification circuit, the contention inhibit circuit, in event of an access contention between a plurality of I/O ports to the given memory cell, generating output signals enabling one of the plurality of I/O ports involved in the access contention and inhibiting all other I/O ports involved in the access contention.

The inventive circuit configuration for handling access contentions is in this case contained as a subcircuit in a multi-port memory. In the event of an access contention, i.e. an access conflict between two or more ports, the circuit configuration for handling access contentions decides the port by which the access can be effected and the port or ports for which the access is rejected.

The novel circuit configuration comprises two subcircuits: the so-called contention identification circuit and the so-called access inhibit circuit.

In accordance with an added feature of the invention, the contention identification circuit generates a status signal specifying the plurality I/O ports involved in the access contention exists and the contention inhibit circuit receives the status signal from the contention identification circuit. The contention inhibit circuit allocates a priority to each of the ports which are involved in the access contention. Based on this prioritization, the highest prioritized port is enabled, while the remaining ports are inhibited. The status of each port, that is to say whether or not the respective access was successful, is indicated in a second status signal for the entire system containing the multi-port memory.

In accordance with an additional feature of the invention, the contention inhibit circuit is adapted to prioritize the I/O ports in accordance with an importance thereof defined by a prioritization algorithm. Two preferred algorithms are presented herein, namely a so-called PIH algorithm and a so-called "fair" IPIH algorithm.

In accordance with another feature of the invention, the contention identification circuit includes a plurality of multi-input EXOR gates performing logic combination of the addresses for selecting the I/O ports involved in the access contention.

With the above and other objects in view, the circuit is provided in combination with a memory device having a memory architecture constructed in multi-level hierarchy.

The system is also provided in combination with a memory device having a memory architecture constructed from multi-port memory cells.

In accordance with a concomitant feature of the invention, the multi-port memory architecture operates according to the switching network principle.

Other features which are considered as characteristic for the invention are set forth in the appended claims.

Although the invention is illustrated and described herein as embodied in a circuit configuration for handling access contentions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic of an exemplary embodiment of a novel access identification circuit, with N=4 ports in the exemplary embodiment;

FIG. 3 is a schematic of a multi-input EXOR gate in ($\alpha$) a symbolic illustration and ($\beta$) as an exemplary embodiment with m=4;

DESCRIPTION OF THE PREFERRED EMBODIMENTS

Figure 1:
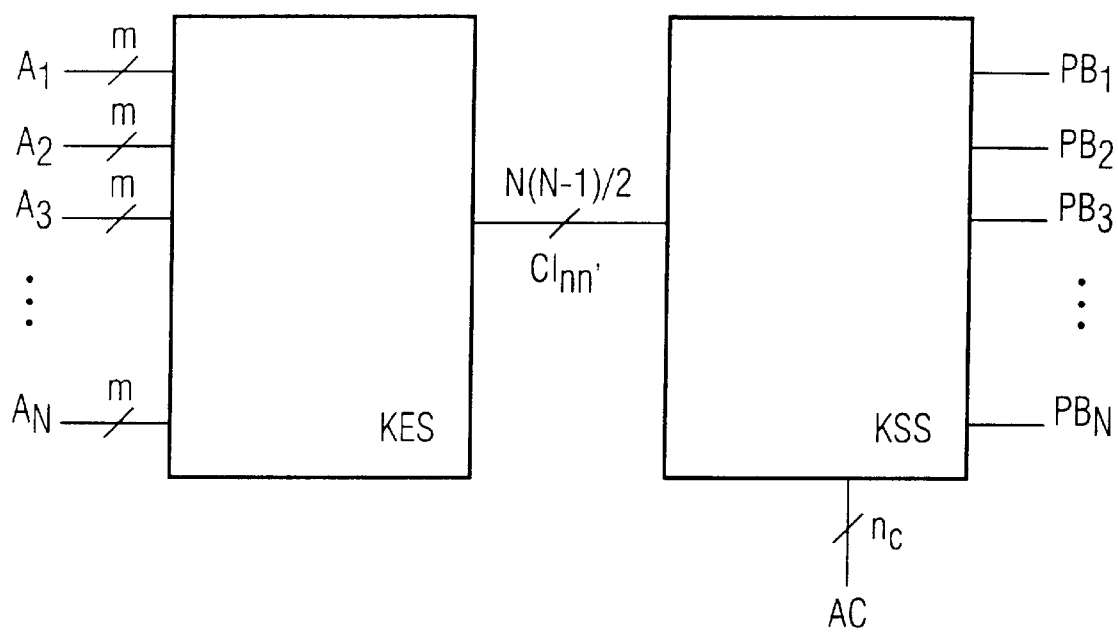
FIG. 1 is a block diagram of a novel configuration for handling access contentions in multi-port memories.

Referring now to the figures of the drawing in detail and first, particularly, to FIG. 1 thereof, there is seen a novel circuit configuration for handling access contentions. The circuit essentially comprises a contention identification circuit KES and a contention inhibit circuit KSS connected downstream in the signal flow direction.

There are provided N different address lines at the input of the circuit configuration for handling access contentions, and thus of the contention identification circuit KES. The number N specifies the number of connection ports of the multi-port memory. Each of the address lines respectively has an address $A_1$–$A_N$ with in each case m address bits.

A pair-by-pair comparison of the address bits $A_1$–$A_N$ is carried out in the contention identification circuit KES in order to identify and ascertain conflict situations. On the output side, the contention identification circuit KES generates a status signal $Cl_{nn'}$, where n may assume the values n=1 to n−1 and n' may assume the values n'=1 to N. Overall, then, the status signal $Cl_{nn'}$ has precisely $N*(N-1)/2$ different signal lines in the case of N different ports. The index nn' of the status signal $Cl_{nn'}$ in this case designates an access contention between two involved ports. For example, a status signal $CL_{35}$ designates an access contention between the 3rd port and the 5th port.

In principle, the status signals $Cl_{nn'}$ could also be transmitted in coded form with fewer signal lines between the contention identification circuit KES and the access inhibit circuit KSS. However, this requires a considerable outlay of coding and decoding and, from the point of view of circuitry, is thus extremely costly in terms of area, particularly in the case of an implementation of the circuit in an integrated circuit.

The status signal $Cl_{nn'}$ is coupled into the input of the access inhibit circuit KSS. The access inhibit circuit KSS then executes an algorithm for resolving an access contention that occurs. The ports involved in the access contention are weighted according to their priority. In this case, the highest prioritized port receives the right of access and access is denied to the remaining ports involved in the access contention.

In addition, an algorithm control signal AC having nc control bits can be provided in the contention inhibit circuit KSS.

N different output lines are provided at the output of the contention inhibit circuit KSS. Each of these output lines is assigned a port inhibit signal $PB_1$–$PB_N$ for each of the N ports of the multi-port memory. In this case, the logic $PB_i=0$ (i=1 ... N) is used for access permission and $PB_i=1$ is used for access denial. Of course it is also possible to use inverted logic for the port inhibit signals $PB_1$–$PB_N$.

FIG. 2 shows an exemplary embodiment of an inventive contention identification circuit KES which is specified to have N=4 ports in the present example. In this case, identical or functionally identical elements corresponding to FIG. 1 have been provided with the same reference symbols.

The contention identification circuit KES has N=4 address ports with the address signals $A_1$–$A_4$ having in each case m address bits. In accordance with the above relationship, the contention identification circuit KES then has $N*(N-1)/2=6$ output lines with the corresponding status signals $Cl_{nn'}$. Each of these status signals $Cl_{nn'}$ is in this case generated on the output side by a so-called multi-input EXOR gate MI. In this case, the number of multi-input EXOR gates MI is likewise calculated from the relationship $N*(N-1)/2$. The multi-input EXOR gates MI are arranged in N−1 different rows. A further row of multi-input EXOR gates MI is thus added for each additional port, and a corresponding number of further status signals $Cl_{nn'}$ are likewise generated. If no access contention occurs, all of the status signals $Cl_{nn'}$ are equal to 1. An access contention that occurs is indicated by one or more of the status signals $Cl_{nn'}$ being set equal to 0.

The multi-input EXOR gates MI in FIG. 2 are shown in simplified form. The exact gate circuit of a multi-input EXOR gate MI of this type is explained in more detail below with reference to FIG. 3. Again, identical or functionally identical elements corresponding to the preceding figures are provided with the same reference symbols and the same indexing.

Subfigure ($\alpha$) in FIG. 3 once again shows the symbol that is generally used here for a multi-input EXOR gate MI, where m represents the number of inputs of the gate circuit. The letters a and b designate the input signals and c designates the output signal. Subfigure ($\beta$) shows an exemplary embodiment of a multi-input EXOR gate MI of this type for the case where m=4. In this case, a conventional EX-NOR gate is required for each of the four inputs. A NAND gate then logically combines all the outputs of these EX-NOR gates and generates the output signal c at the output.

The method of operation of the inventive access inhibit circuit KSS, based on the exemplary embodiment in FIG. 2, is explained below with reference to FIGS. 4 and 5. In this case, two exemplary embodiments are presented which use two different prioritization algorithms to control the system in the event of an access contention. The designation of the various elements and their indexing has been adopted from FIGS. 1 and 2.

Figure 4:
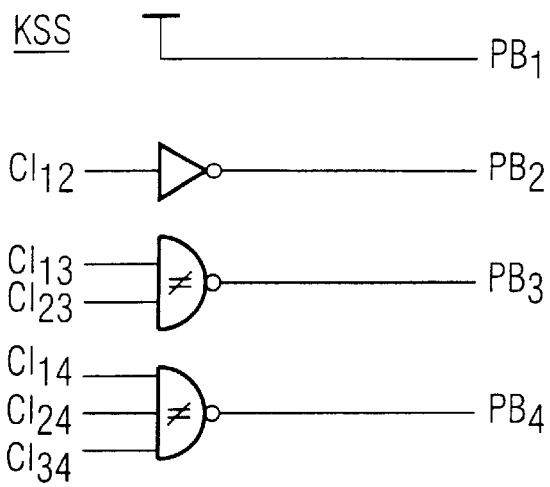
FIG. 4 is a schematic of a circuit configuration for implementing a PIH algorithm in the case of N=4 ports.

The first algorithm in accordance with FIG. 4 is generally referred to as the PIH algorithm (Port Importance Hierarchy algorithm). An order of priority of the importance of the ports is defined in the PIH algorithm. For example, an order of priority is defined in such a way that port 1 is more important than port 2, that port 2 is in turn more important than port 3, etc. The port having the least importance is then, finally, the port N. This can also be represented using the > character as a symbol for higher importance in the form below:

Port 1>Port 2>Port 3> . . . >Port N.

A conflict situation is then always resolved such that the involved port having the highest importance receives the right of access and that access is denied to all of the other ports involved. In particular, access is denied to port N in every access conflict situation in which it is involved given this PIH algorithm.

The PIH algorithm has the advantage that it can be implemented with the simple circuit configuration shown in FIG. 4. This circuit configuration has simple NAND gates. For a given port i, the status signals $Cl_{nn'}$ which signal a conflict (contention) between port i and a port of higher priority are logically combined with a NAND function in a simple manner in the case of the PIH algorithm. If one of the status signals becomes 0, that is to say if an access contention with a port of higher priority occurs, a port inhibit signal $PB_i=1$ is generated, which in turn means that access is denied to the port i.

For many system requirements the fact of the different probability of rejection of an access demand by the various ports of the multi-port memory, as is the case with the PIH algorithm, may be an intolerable disadvantage. In this case, a preferable algorithm is one which realizes an equal probability for access by each port. Such an algorithm is generally also referred to as a "fair" algorithm.

Figure 5:
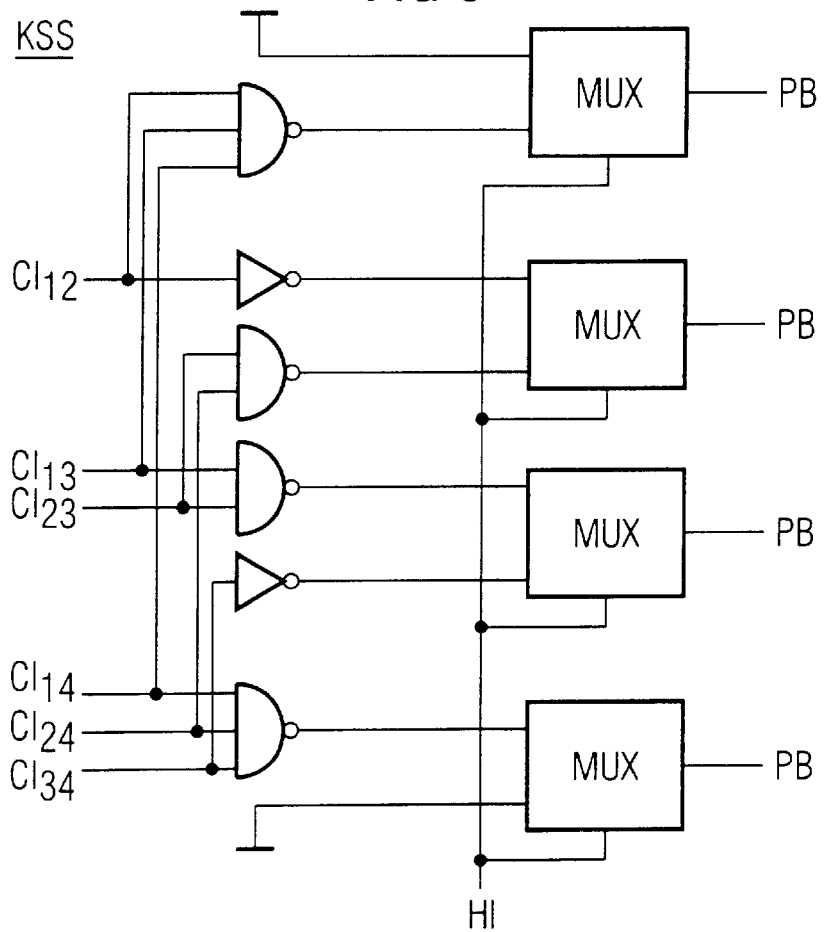
FIG. 5 is a schematic of a circuit configuration for implementing the IPIH algorithm in the case of N=4 ports.

An exemplary embodiment of an access inhibit circuit which realizes such a "fair" algorithm in a simple manner is specified in FIG. 5. The "fair" algorithm is also referred to below as IPIH algorithm (Inverted Port Importance Hierarchy algorithm). In the case of the IPIH algorithm, the access is alternated and regulated according to a given port hierarchy and the port hierarchy which is inverted with respect thereto. In each case an output signal for the given port hierarchy and an output signal for the port hierarchy which is inverted with respect thereto are respectively fed to a multiplexer circuit MUX. In the present example, the multiplexer circuit MUX comprises a simple multiplexer which selects one of the two input signals. This selected signal is then made available at the output as port inhibit signal $PB_1$–$PB_4$. The alternating change is controlled by the hierarchy inversion signal HI, which may be the algorithm signal from FIG. 1, for example. The access probability thereby becomes, on average, equal for each port.

In specific terms, in the IPIH algorithm a change is effected between the normal hierarchy (corresponding to the IPH algorithm) of the corresponding port according to the relationship:

Port 1>Port 2>Port 3> . . . >Port N and the hierarchy inverted with respect thereto:

Port N>Port (N−1)>Port (N−2)> . . . >Port 2>Port 1 in the course of resolving conflict situations.

The change is controlled by the hierarchy inversion signal HI. The change can be effected during each access cycle or in each case after a fixed number of access cycles and is typically derived from the clock signal in the case of synchronous memories. In this way, there is produced an access probability that is, on average, equal for each port.

It will be appreciated by those skilled in the pertinent art and it goes without saying that other algorithms for handling access contentions are relatively easily designed. The one described above, however, is a possible way of obtaining parallel handling of access contentions in multi-port memories in a simple manner and with little circuitry.

The invention is particularly advantageous when the circuit configuration for handling access contentions is used in a memory architecture constructed from multi-port memory cells. In this case, this memory architecture may be constructed in a so-called multi-level hierarchy. Furthermore, however, the circuit configuration can also advantageously be used in a multi-port memory architecture operating according to the switching network principle.

I claim:

1. A circuit configuration for handling access contentions in a memory with N mutually independent, simultaneously addressable I/O ports, comprising:

at least one contention identification circuit for identifying an access contention between a plurality of said I/O ports to a given memory cell of said memory;

at least one contention inhibit circuit connected to said contention identification circuit, said contention inhibit circuit constructed for receiving status signals of said contention identification circuit, and in an event of an access contention between a plurality of said I/O ports to the given memory cell, generating output signals enabling one of said plurality of said I/O ports involved in said access contention and inhibiting all other ones of said plurality of said I/O ports involved in said access contention; and N(N−1)/2 signal lines connecting said contention identification circuit to said contention inhibit circuit, said contention identification circuit generating said status signals on said signal lines, said status signals defining which ones of said I/O ports are involved in said access contention;

said contention identification circuit including N(N−1)/2 multiple input EXOR gates for generating said status signals as a logic combination of addresses of said N I/O ports; and said contention inhibit circuit constructed for prioritizing said I/O ports in accordance with an importance thereof defined by a prioritization algorithm.

2. The circuit configuration according to claim 1, wherein the prioritization algorithm is a Port Importance Hierarchy algorithm.

3. The circuit configuration according to claim 1, wherein the prioritization algorithm is an Inverted Port Importance Hierarchy algorithm.

* * * * *